US012402281B2

United States Patent
Xiao et al.

(10) Patent No.: US 12,402,281 B2
(45) Date of Patent: Aug. 26, 2025

(54) HEAT DISSIPATION ASSEMBLY FOR A TERMINAL DEVICE

(71) Applicant: Huawei Technologies Co., Ltd., Shenzhen (CN)

(72) Inventors: Yongwang Xiao, Shanghai (CN); Linfang Jin, Dongguan (CN); Hualin Li, Shanghai (CN); Naixiang Xu, Shanghai (CN); Guoping Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 126 days.

(21) Appl. No.: 18/505,673

(22) Filed: Nov. 9, 2023

(65) Prior Publication Data

US 2024/0081026 A1 Mar. 7, 2024

Related U.S. Application Data

(63) Continuation of application No. 17/284,381, filed as application No. PCT/CN2019/107624 on Sep. 25, 2019, now abandoned.

(30) Foreign Application Priority Data

Oct. 15, 2018 (CN) .......................... 201811205613.3
Dec. 27, 2018 (CN) .......................... 201811609350.2

(51) Int. Cl.
*H05K 7/20* (2006.01)
*G06F 1/20* (2006.01)
*H04M 1/02* (2006.01)

(52) U.S. Cl.
CPC ......... *H05K 7/20336* (2013.01); *G06F 1/203* (2013.01); *H05K 7/20481* (2013.01); *H04M 1/026* (2013.01)

(58) Field of Classification Search
CPC .......... H05K 7/20472–20481; H05K 7/20509; H05K 7/20963; H05K 7/2099; H05K 7/20336; H05K 1/0203; G06F 1/203
See application file for complete search history.

(56) References Cited

U.S. PATENT DOCUMENTS

| 8,202,765 B2 | 6/2012 | Casey et al. |
| 9,233,850 B2 | 1/2016 | Jang et al. |
| 9,360,905 B2 | 6/2016 | Zhamu et al. |
| 9,431,319 B2 | 8/2016 | Olsen et al. |

(Continued)

FOREIGN PATENT DOCUMENTS

| CN | 103235436 A | 8/2013 |
| CN | 203233631 U | 10/2013 |

(Continued)

*Primary Examiner* — Zachary Pape
(74) *Attorney, Agent, or Firm* — Slater Matsil, LLP (57) ABSTRACT

Embodiments of this application provide a terminal device, including a middle frame, a heat source device, a first heat dissipation assembly, and a second heat dissipation assembly, where the first heat dissipation assembly is disposed on one side of the middle frame, the heat source device and the second heat dissipation assembly are disposed on the other side of the middle frame, and at least one of the first heat dissipation assembly and the second heat dissipation assembly is a graphene heat dissipation assembly.

18 Claims, 4 Drawing Sheets

(56) References Cited

U.S. PATENT DOCUMENTS

| | | | |
|---|---|---|---|
| 10,437,299 B2 * | 10/2019 | Wang | H05K 7/205 |
| 2011/0247795 A1 | 10/2011 | Horng | |
| 2014/0240926 A1 | 8/2014 | Choi | |
| 2015/0271950 A1 | 9/2015 | Hagiwara et al. | |
| 2016/0007504 A1 | 1/2016 | Wu | |
| 2016/0282914 A1 | 9/2016 | Saito | |
| 2017/0238442 A1 | 8/2017 | Zhang | |
| 2017/0315598 A1 | 11/2017 | Voth et al. | |
| 2018/0035528 A1 | 2/2018 | Kim et al. | |

FOREIGN PATENT DOCUMENTS

| | | |
|---|---|---|
| CN | 203882256 U | 10/2014 |
| CN | 104869184 A | 8/2015 |
| CN | 104882613 A | 9/2015 |
| CN | 204633838 U | 9/2015 |
| CN | 105228413 A | 1/2016 |
| CN | 205546375 U | 8/2016 |
| CN | 205681514 U | 11/2016 |
| CN | 106304817 A | 1/2017 |
| CN | 106790797 A | 5/2017 |
| CN | 206181696 U | 5/2017 |
| CN | 107168464 A | 9/2017 |
| CN | 107249283 A | 10/2017 |
| CN | 107249285 A | 10/2017 |
| CN | 107509365 A | 12/2017 |
| CN | 107592386 A | 1/2018 |
| CN | 107660099 A | 2/2018 |
| CN | 206962867 U | 2/2018 |
| CN | 207219261 U | 4/2018 |
| CN | 207368170 U | 5/2018 |
| CN | 108513519 A | 9/2018 |
| CN | 207817623 U | 9/2018 |
| CN | 108617082 A | 10/2018 |
| KR | 20150024664 A | 3/2015 |

* cited by examiner

HEAT DISSIPATION ASSEMBLY FOR A TERMINAL DEVICE

CROSS-REFERENCE TO RELATED APPLICATIONS

This application is a continuation of U.S. patent application Ser. No. 17/284,381, filed on Apr. 9, 2021, which is a national stage of International Application No. PCT/CN2019/107624, filed on Sep. 25, 2019, which claims priority to Chinese Patent Application No. 201811205613.3, filed on Oct. 15, 2018 and Chinese Patent Application No. 201811609350.2, filed on Dec. 27, 2018. All of the aforementioned applications are hereby incorporated by reference in their entireties.

TECHNICAL FIELD

This application relates to the field of electronic technologies, and in particular, to a terminal device.

BACKGROUND

Currently, a processing module (for example, a processor) with high computing performance is disposed in many terminal devices (for example, a mobile phone and a tablet computer), and a large amount of heat is generated in a working process of the processing module.

The heat generated by the processing module affects performance of the processing module and another component in an electronic device, and causes poor user experience. In the prior art, a plurality of layers of graphite sheets are usually disposed in the electronic device, and the heat generated by the processing module is dissipated by the plurality of layers of graphite sheets. Usually, a double-sided tape is used for bonding between the plurality of layers of graphite sheets. Because of poor heat conductivity of the double-sided tape, heat conductivity of the plurality of layers of graphite sheets is poor. Consequently, a heat dissipation effect of the plurality of layers of graphite sheets on the terminal device is poor.

SUMMARY

This application provides a terminal device, to improve heat dissipation efficiency of the terminal device.

Embodiments of this application provide a terminal device, including a middle frame, a heat source device, a first heat dissipation assembly, and a second heat dissipation assembly, where the first heat dissipation assembly is disposed on one side of the middle frame, the heat source device and the second heat dissipation assembly are disposed on the other side of the middle frame, and at least one of the first heat dissipation assembly and the second heat dissipation assembly is a graphene heat dissipation assembly.

Because the terminal device includes at least one graphene heat dissipation assembly and the graphene heat dissipation assembly has relatively good heat transfer performance, the graphene heat dissipation assembly may quickly transfer heat generated by the heat source device, to improve heat dissipation efficiency of the terminal device. In this way, the heat may be more evenly distributed in the terminal device. Because a thickness of the graphene heat dissipation assembly is relatively small, the first heat dissipation assembly or the second heat dissipation assembly occupies relatively little space in the terminal device, so that a thickness of the terminal device is relatively small.

In a possible implementation, a projection of the heat source device on the middle frame and a projection of the first heat dissipation assembly on the middle frame have an overlapping part.

In a possible implementation, the projection of the heat source device on the middle frame is located in a projection of the first heat dissipation assembly on the middle frame.

In an actual application process, after the heat source device generates the heat, the heat source device quickly transfers the heat to an area (briefly referred to as a first area below) that is in the middle frame and that faces the heat source device. When the projection of the heat source device on the middle frame and the projection of the first heat dissipation assembly on the middle frame have the overlapping part, a part or all of the first area further faces the first heat dissipation assembly, so that heat in the first area is quickly transferred to the first heat dissipation assembly, to further improve heat dissipation efficiency.

In a possible implementation, the projection of the heat source device on the middle frame and a projection of the second heat dissipation assembly on the middle frame have an overlapping part.

In a possible implementation, the projection of the heat source device on the middle frame is located in the projection of the second heat dissipation assembly on the middle frame.

In an actual application process, after the heat source device generates the heat, when the projection of the heat source device on the middle frame and the projection of the second heat dissipation assembly on the middle frame have the overlapping part, the heat generated by the heat source device may be quickly transferred to the second heat dissipation assembly, to improve heat dissipation efficiency.

In a possible implementation, the graphene heat dissipation assembly is a single-layer graphene sheet. Because a thickness of the single-layer graphene sheet is relatively small, the first heat dissipation assembly or the second heat dissipation assembly occupies relatively little space in the terminal device, so that the thickness of the terminal device is relatively small.

In a possible implementation, at least one of the following heat conductive materials is composited in the single-layer graphene sheet: copper and carbon fiber.

In a possible implementation, an avoidance hole is disposed on the graphene heat dissipation assembly. In this way, it is convenient to install internal components of the terminal device.

In a possible implementation, the terminal device further includes a liquid cooling pipe, and the liquid cooling pipe is attached to the middle frame. The liquid cooling pipe may quickly transfer the heat, to improve heat dissipation efficiency. Further, temperature distribution in the terminal device may be more even through temperature transfer of the liquid cooling pipe.

In a possible implementation, a projection of the liquid cooling pipe on the middle frame and the projection of the heat source device on the middle frame have an overlapping part.

In an actual application process, after the heat source device generates the heat, the heat source device quickly transfers the heat to an area (briefly referred to as a first area below) that is in the middle frame and that faces the heat source device. When the projection of the liquid cooling pipe on the middle frame and the projection of the heat source device on the middle frame have the overlapping part, a part or all of the first area further faces the liquid cooling pipe, so that heat in the first area is quickly transferred to the liquid cooling pipe, to further improve heat dissipation efficiency.

In a possible implementation, the projection of the liquid cooling pipe on the middle frame is located in the projection of the first heat dissipation assembly on the middle frame.

When the projection of the liquid cooling pipe on the middle frame is located in the projection of the first heat dissipation assembly on the middle frame, the liquid cooling pipe may quickly transfer the heat to the first heat dissipation assembly, so that the first heat dissipation assembly may quickly dissipate the heat, to improve heat dissipation efficiency.

In a possible implementation, the liquid cooling pipe is disposed on a side, of the middle frame, facing the first heat dissipation assembly, and the liquid cooling pipe is further attached to the first heat dissipation assembly.

The liquid cooling pipe is attached to the first heat dissipation assembly, so that the liquid cooling pipe can quickly transfer the heat to the first heat dissipation assembly, to improve heat dissipation efficiency.

In a possible implementation, the liquid cooling pipe is disposed on a side, of the middle frame, facing the second heat dissipation assembly.

In a possible implementation, the liquid cooling pipe includes any one of an ultra-thin heat pipe, an ultra-thin vapor chamber, or a loop heat pipe.

In a possible implementation, the liquid cooling pipe is accommodated in a groove that matches a shape of the liquid cooling pipe and that is disposed on the middle frame. In this way, a contact area between the liquid cooling pipe and the middle frame can be increased, so that the liquid cooling pipe quickly transfers the heat to the middle frame, and the liquid cooling pipe can be fastened more firmly.

In a possible implementation, a part of the liquid cooling pipe is close to the heat source device, and the other part of the liquid cooling pipe is far away from the heat source device. The part, of the liquid cooling pipe, close to the heat source device is less than the other part, of the liquid cooling pipe, far away from the heat source device.

In a possible implementation, a thickness of the first heat dissipation assembly is different from a thickness of the second heat dissipation assembly.

In a possible implementation, a thickness of the first heat dissipation assembly or the second heat dissipation assembly is 42 micrometers. Because the thickness of the first heat dissipation assembly or the second heat dissipation assembly is relatively small, the first heat dissipation assembly or the second heat dissipation assembly occupies relatively little space in the terminal device, so that the thickness of the terminal device is relatively small.

In a possible implementation, the terminal device further includes a display screen, and the display screen is disposed on the middle frame.

In a possible implementation, the display screen covers the first heat dissipation assembly.

In a possible implementation, the terminal device further includes a housing. The housing is disposed on the middle frame, and the housing covers the second heat dissipation assembly. The housing may protect the terminal device.

In a possible implementation, the display screen covers the first heat dissipation assembly and the second heat dissipation assembly.

In a possible implementation, two sides of the heat source device are wrapped with a metal shielding can. The metal shielding can may reduce electromagnetic interference of another component to the heat source device.

The embodiments of this application provide the terminal device, including the middle frame, the heat source device, the first heat dissipation assembly, and the second heat dissipation assembly, where the first heat dissipation assembly is disposed on one side of the middle frame, the heat source device and the second heat dissipation assembly are disposed on the other side of the middle frame, and at least one of the first heat dissipation assembly and the second heat dissipation assembly is the graphene heat dissipation assembly. Because the terminal device includes at least one graphene heat dissipation assembly and the graphene heat dissipation assembly has relatively good heat transfer performance, the graphene heat dissipation assembly may quickly transfer the heat generated by the heat source device, to improve heat dissipation efficiency of the terminal device. In this way, the heat may be more evenly distributed in the terminal device. Because the thickness of the graphene heat dissipation assembly is relatively small, the first heat dissipation assembly or the second heat dissipation assembly occupies relatively little space in the terminal device, so that the thickness of the terminal device is relatively small.

DETAILED DESCRIPTION OF ILLUSTRATIVE EMBODIMENTS

The following describes the embodiments of this application with reference to the accompanying drawings in the embodiments of this application.

From understanding of a person skilled in the art, graphite is an allotrope of an element carbon, and the graphite has good electrical and heat conductivity. Common graphite is formed by stacking layers of planar carbon atoms that are arranged in a honeycomb shape order, and interlayer force of the graphite is relatively weak. Therefore, layers of the graphite are likely to be stripped from each other, and thin graphite sheets are formed.

When the graphite sheet is stripped into a single layer, the single layer with only one carbon atom thickness is graphene. A research shows that the graphene has super high heat conductivity. In an ideal condition, the heat conductivity of the graphene is up to 5300 W/m·K, which is more than 10 times that of copper.

An embodiment of this application provides a terminal device that dissipates heat by using graphene. The terminal device may be a mobile phone, a tablet computer, an e-reader, a notebook computer, a vehicle-mounted device, a wearable device, or the like. A graphene heat dissipation assembly is disposed in the terminal device. Because the graphene heat dissipation assembly has relatively good heat transfer performance, the graphene heat dissipation assembly may quickly transfer heat generated by a heat source device, to improve heat dissipation efficiency of the terminal device. In this way, the heat may be more evenly distributed in the terminal device. Because a thickness of the graphene heat dissipation assembly is relatively small, a first heat dissipation assembly or a second heat dissipation assembly occupies relatively little space in the terminal device, so that a thickness of the terminal device is relatively small.

The following describes in detail a structure of the terminal device shown in this application by using specific embodiments. It should be noted that the following several embodiments may exist separately, or may be combined with each other. Same or similar content is not repeatedly described in different embodiments.

Figure 1:
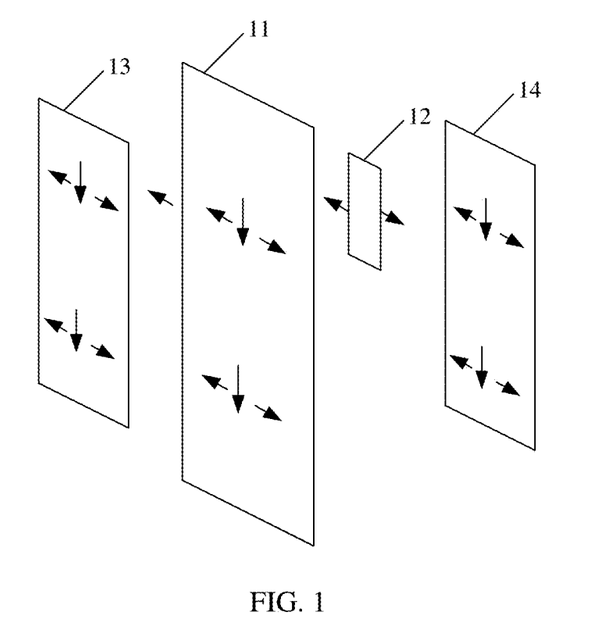
FIG. 1 is a schematic diagram of a structure of a terminal device according to an embodiment of this application.

FIG. 1 is a schematic diagram of a structure of a terminal device according to an embodiment of this application. Referring to FIG. 1, the terminal device may include a middle frame 11, a heat source device 12, a first heat dissipation assembly 13, and a second heat dissipation assembly 14. The first heat dissipation assembly 13 is disposed on one side of the middle frame 11, and the heat source device 12 and the second heat dissipation assembly 14 are disposed on the other side of the middle frame 11. At least one of the first heat dissipation assembly 13 and the second heat dissipation assembly 14 is a graphene heat dissipation assembly.

The middle frame 11 may be a framework structure of the terminal device, and some or all other components of the terminal device may be directly or indirectly disposed on the middle frame 11, to form the terminal device.

Optionally, the middle frame 11 may be disposed inside the terminal device, and an edge of the middle frame 11 may be designed as a part of a housing of the terminal device. When the edge of the middle frame 11 is used as the housing of the terminal device, a function of protecting the terminal device may be implemented.

Optionally, the middle frame 11 may have a planar structure or a structure similar to a planar structure. Therefore, two side faces of the middle frame 11 may be visually distinguished. The two side faces may be referred to as a front face and a rear face of the middle frame 11, or the two side faces may be referred to as a side face and another side face of the middle frame 11. Inside the middle frame 11, a part of the middle frame 11 may be hollowed out based on a requirement, to dispose other components in the terminal device.

Optionally, a part or all of the middle frame 11 may be made of a metal material or an alloy material (for example, an aluminum alloy). Certainly, the middle frame 11 may alternatively be made of another material. This is not specifically limited in this embodiment of this application.

In this embodiment of this application, the heat source device 12 is a device that radiates relatively much heat in the terminal device.

In an actual application process, heat radiated by a component is usually positively correlated with power consumption of the component. More power consumption of the component indicates more heat radiated by the component. Correspondingly, the heat source device 12 in this application may be a device whose power consumption exceeds M % of overall power consumption in the terminal device, and M may be 30, 40, or the like.

Optionally, the heat source device 12 may include a processor, a processor device integrating processing and storage functions, a power supply component (for example, a battery), and the like. Certainly, the heat source device 12 may alternatively be another device. This is not specifically limited in this embodiment of this application.

Optionally, the first heat dissipation assembly 13 and the second heat dissipation assembly 14 may be graphene heat dissipation assemblies. Alternatively, the first heat dissipation assembly 13 is the graphene heat dissipation assembly, and the second heat dissipation assembly 14 is a multi-layer graphite heat dissipation assembly. Alternatively, the first heat dissipation assembly 13 is a multi-layer graphite heat dissipation assembly, and the second heat dissipation assembly 14 is the graphene heat dissipation assembly.

Optionally, the graphene heat dissipation assembly may be of a sheet structure.

Optionally, a thickness of the first heat dissipation assembly 13 is different from a thickness of the second heat dissipation assembly 14.

Optionally, the thickness of the first heat dissipation assembly 13 or the second heat dissipation assembly 14 is greater than or equal to 40 micrometers. Optionally, the thickness of the first heat dissipation assembly 13 or the second heat dissipation assembly 14 is 42 micrometers.

In an actual application process, an avoidance hole may be disposed on the graphene heat dissipation assembly based on an actual requirement, to facilitate installation of another component in the terminal device. Optionally, the first heat dissipation assembly 13 or the second heat dissipation assembly 14 may be bent arbitrarily based on a space requirement inside the terminal device.

Optionally, the graphene heat dissipation assembly may be a single-layer graphene sheet. At least one of the following heat conductive materials may be further composited in the single-layer graphene sheet: copper and carbon fiber. Certainly, in an actual application process, another heat conductive material may be further composited in the single-layer graphene sheet.

In this embodiment of this application, one side of the middle frame 11 is opposite to the other side of the middle frame 11. Optionally, one side of the middle frame 11 may be the front face of the middle frame 11, and the other side of the middle frame 11 may be the rear face of the middle frame 11.

Optionally, The heat source device 12 is partially or completely attached to the middle frame 11. For example, the heat source device 12 may be fastened to the middle frame 11. Alternatively, the heat source device 12 may be disposed on another component (for example, a circuit board), and the another component is disposed on the middle frame 11, so that the heat source device 12 is partially or completely attached to the middle frame 11.

Optionally, the heat source device 12 is disposed between the middle frame 11 and the second heat dissipation assembly 14. The heat source device 12 may be partially or completely attached to the second heat dissipation assembly 14.

Optionally, the first heat dissipation assembly 13 may be partially or completely attached to the middle frame 11.

The following describes a heat dissipation process of the terminal device shown in the embodiment in FIG. 1.

In a running process of the terminal device, the heat source device 12 of the terminal device generates heat, and the heat generated by the heat source device 12 dissipates along each radius of a sphere by using the heat source device 12 as a sphere center. Because a distance between the middle frame 11 and the heat source device 12 is relatively short, the heat generated by the heat source device 12 may be quickly transferred to a part (for example, a part attached to the heat source device 12) that is in the middle frame 11 and that is relatively close to the heat source device 12. The middle frame 11 transfers the received heat inside the middle frame 11. In addition, the middle frame 11 further transfers the heat to the first heat dissipation assembly 13. After the first heat dissipation assembly 13 receives the heat transferred by the middle frame 11, the first heat dissipation assembly 13 transfers the received heat inside the first heat dissipation assembly 13. In addition, the first heat dissipation assembly 13 further transfers the heat to the middle frame 11 or another component (such as a display screen or a housing). When the heat is transferred inside a component (the middle frame 11 or the first heat dissipation assembly 13), the heat is transferred from a high-temperature part of the component to a low-temperature part of the component. When the heat is transferred between the first heat dissipation assembly and the middle frame 11, the first heat dissipation assembly 13 may transfer the heat to the middle frame 11, and the middle frame 11 may also transfer the heat to the first heat dissipation assembly 13.

The heat generated by the heat source device 12 may be further transferred to the second heat dissipation assembly 14. When the second heat dissipation assembly 14 receives the heat transferred by the heat source device 12, the second heat dissipation assembly 14 transfers the received heat inside the second heat dissipation assembly 14. In addition, the second heat dissipation assembly 14 further transfers the heat to the middle frame 11 or another component (such as the display screen or the housing). Optionally, when the heat is transferred between the second heat dissipation assembly and the middle frame 11, the second heat dissipation assembly 14 may transfer the heat to the middle frame 11, and the middle frame 11 may also transfer the heat to the second heat dissipation assembly 14.

According to the middle frame 11, the heat source device 12, the first heat dissipation assembly 13, and the second heat dissipation assembly 14 of the terminal device provided in this embodiment of this application, the first heat dissipation assembly 13 is disposed on one side of the middle frame 11, and the heat source device 12 and the second heat dissipation assembly 14 are disposed on the other side of the middle frame 11. At least one of the first heat dissipation assembly 13 and the second heat dissipation assembly 14 is the graphene heat dissipation assembly. Because the terminal device includes at least one graphene heat dissipation assembly and the graphene heat dissipation assembly has relatively good heat transfer performance, the graphene heat dissipation assembly may quickly transfer the heat generated by the heat source device 12, to improve heat dissipation efficiency of the terminal device. In this way, the heat may be more evenly distributed in the terminal device. Because a thickness of the graphene heat dissipation assembly is relatively small, the first heat dissipation assembly 13 or the second heat dissipation assembly 14 occupies relatively little space in the terminal device, so that a thickness of the terminal device is relatively small.

Based on any one of the foregoing embodiments, optionally, a projection of the heat source device 12 on the middle frame 11 and a projection of the first heat dissipation assembly 13 on the middle frame 11 have an overlapping part.

Figure 2A:
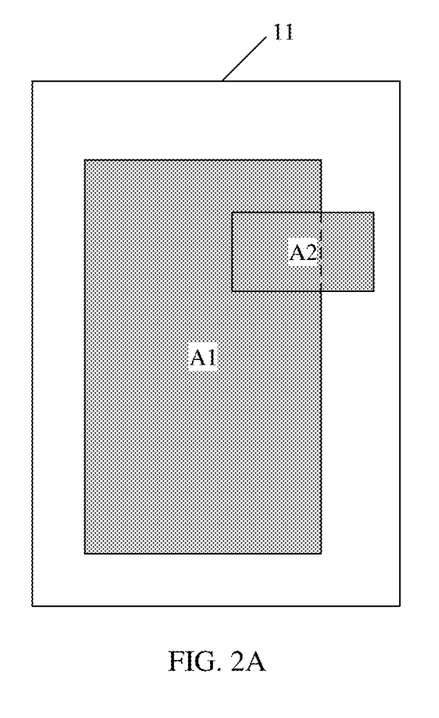
FIG. 2A is a schematic diagram of a projection according to an embodiment of this application.
Figure 2B:
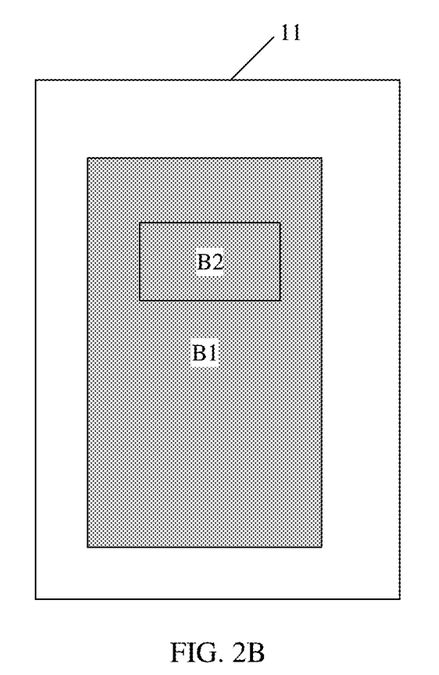
FIG. 2B is a schematic diagram of another projection according to an embodiment of this application.

The following describes in detail the projection of the heat source device 12 on the middle frame 11 and the projection of the first heat dissipation assembly 13 on the middle frame 11 with reference to FIG. 2A and FIG. 2B.

FIG. 2A is a schematic diagram of a projection according to an embodiment of this application. FIG. 2B is a schematic diagram of another projection according to an embodiment of this application.

Referring to FIG. 2A, the projection of the first heat dissipation assembly on the middle frame 11 is A1, and the projection of the heat source device 12 on the middle frame 11 is A2. A part of the projection A2 of the heat source device 12 on the middle frame 11 overlaps a part of the projection A1 of the first heat dissipation assembly 13 on the middle frame 11.

Referring to FIG. 2B, the projection of the first heat dissipation assembly on the middle frame 11 is B1, and the projection of the heat source device 12 on the middle frame 11 is B2. The projection B2 of the heat source device 12 on the middle frame 11 is located in the projection B1 of the first heat dissipation assembly 13 on the middle frame 11.

In an actual application process, after the heat source device 12 generates the heat, the heat source device 12 quickly transfers the heat to an area (briefly referred to as a first area below) that is in the middle frame 11 and that faces the heat source device 12. When the projection of the heat source device 12 on the middle frame 11 and the projection of the first heat dissipation assembly 13 on the middle frame 11 have an overlapping part, a part or all of the first area further faces the first heat dissipation assembly 13, so that heat in the first area is quickly transferred to the first heat dissipation assembly, to further improve heat dissipation efficiency.

Based on any one of the foregoing embodiments, optionally, the projection of the heat source device 12 on the middle frame 11 and the projection of the second heat dissipation assembly 14 on the middle frame 11 have an overlapping part.

Optionally, the projection of the heat source device 12 on the middle frame 11 is located in the projection of the second heat dissipation assembly 14 on the middle frame 11.

It should be noted that for the projection of the heat source device 12 on the middle frame 11 and the projection of the second heat dissipation assembly 14 on the middle frame 11, refer to FIG. 2A and FIG. 2B. Details are not described herein again.

In an actual application process, after the heat source device 12 generates the heat, when the projection of the heat source device 12 on the middle frame 11 and the projection of the second heat dissipation assembly 14 on the middle frame 11 have the overlapping part, the heat generated by the heat source device 12 may be quickly transferred to the second heat dissipation assembly 14, to improve heat dissipation efficiency.

Based on any one of the foregoing embodiments, optionally, to improve heat dissipation efficiency and make temperature distribution in the terminal device more even, the liquid cooling pipe 15 may be further disposed in the terminal device.

Optionally, the liquid cooling pipe 15 includes any one of an ultra-thin heat pipe, an ultra-thin vapor chamber, or a loop heat pipe.

Optionally, the liquid cooling pipe 15 may be attached to the middle frame 11.

Optionally, the liquid cooling pipe 15 may be attached to the middle frame 11 through adhesive bonding, welding, or the like.

For example, an opening groove that matches a shape of the liquid cooling pipe 15 may be disposed on the middle frame 11, and the liquid cooling pipe 15 is disposed in the opening groove. The opening groove may be a groove.

Optionally, the liquid cooling pipe 15 may be disposed on one side of the middle frame 11, or may be disposed on the other side of the middle frame 11. The following describes, with reference to FIG. 3 and FIG. 4, a structure of a terminal device on which the liquid cooling pipe 15 is disposed.

Figure 3:
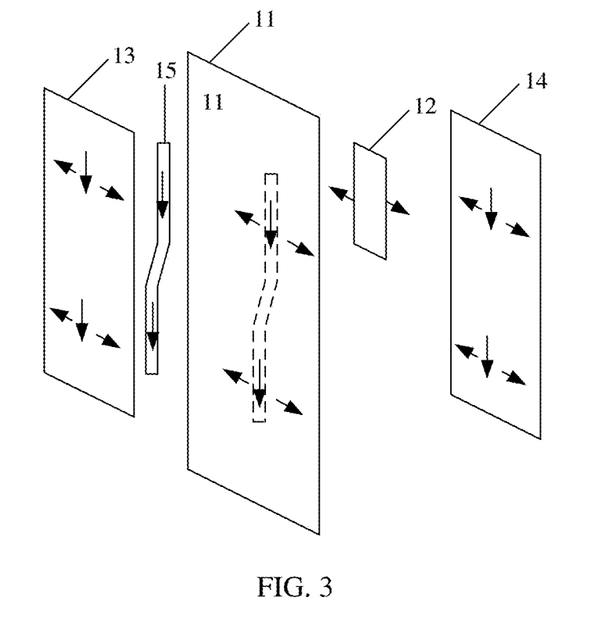
FIG. 3 is a schematic diagram of a structure of another terminal device according to an embodiment of this application.
Figure 4:
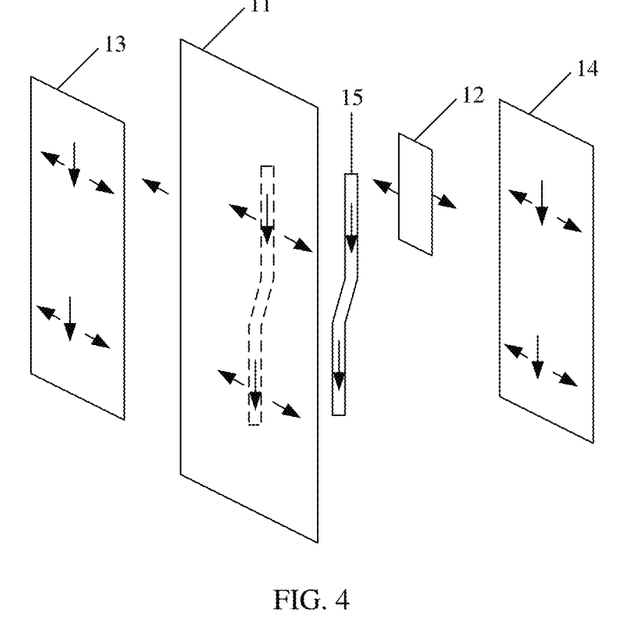
FIG. 4 is a schematic diagram of a structure of still another terminal device according to an embodiment of this application.

FIG. 3 is a schematic diagram of a structure of another terminal device according to an embodiment of this application. FIG. 4 is a schematic diagram of a structure of still another terminal device according to an embodiment of this application.

Referring to FIG. 3, a liquid cooling pipe 15 is disposed on a side, of a middle frame 11, facing a first heat dissipation assembly 13. Optionally, the liquid cooling pipe 15 may further be attached to the first heat dissipation assembly 13.

The following describes a heat dissipation process of the terminal device shown in the embodiment in FIG. 3.

In a running process of the terminal device, a heat source device 12 of the terminal device generates heat, and the heat source device 12 first transfers the heat to a part that is in the middle frame 11 and that is relatively close to the heat source device 12 (for example, a part attached to the heat source device 12). The middle frame 11 transfers the received heat inside the middle frame 11. In addition, the middle frame 11 further transfers the heat to one end of the first heat dissipation assembly 13 and one end of the liquid cooling pipe 15. After one end of the liquid cooling pipe 15 receives the heat, the liquid cooling pipe 15 may quickly transfer the heat to the entire liquid cooling pipe 15, so that temperature is relatively evenly distributed in the entire liquid cooling pipe 15. Because the liquid cooling pipe 15 is attached to the middle frame 11, the liquid cooling pipe 15 may transfer the heat to a part that is in the middle frame 11 and that is attached to the liquid cooling pipe 15, and the heat is transferred from the part to another part of the middle frame 11, so that temperature of all parts in the terminal is relatively even. In addition, the liquid cooling pipe 15 further transfers the heat to the first heat dissipation assembly 13. After the first heat dissipation assembly 13 receives the heat transferred by the middle frame 11 and/or the liquid cooling pipe 15, the first heat dissipation assembly 13 transfers the received heat inside the first heat dissipation assembly 13. In addition, the first heat dissipation assembly 13 further transfers the heat to the middle frame 11 or another component (such as a display screen or a housing). When the heat is transferred inside a component (the middle frame 11, the first heat dissipation assembly 13, or the liquid cooling pipe 15), the heat is transferred from a high-temperature part of the component to a low-temperature part of the component. When the heat is transferred among the first heat dissipation assembly, the middle frame 11, and the liquid cooling pipe 15, the heat may be transferred among the three.

The heat generated by the heat source device 12 may be further transferred to a second heat dissipation assembly 14. When the second heat dissipation assembly 14 receives the heat transferred by the heat source device 12, the second heat dissipation assembly 14 transfers the received heat inside the second heat dissipation assembly 14. In addition, the second heat dissipation assembly 14 further transfers the heat to the middle frame 11 or another component (such as the display screen or the housing). Optionally, when the heat is transferred between the second heat dissipation assembly and the middle frame 11, the second heat dissipation assembly 14 may transfer the heat to the middle frame 11, and the middle frame 11 may also transfer the heat to the second heat dissipation assembly 14.

Optionally, a projection of the liquid cooling pipe 15 on the middle frame 11 and a projection of the heat source device 12 on the middle frame 11 have an overlapping part.

In an actual application process, after the heat source device 12 generates the heat, the heat source device 12 quickly transfers the heat to an area (briefly referred to as a first area below) that is in the middle frame 11 and that faces the heat source device 12. When the projection of the liquid cooling pipe 15 on the middle frame 11 and the projection of the heat source device 12 on the middle frame 11 have an overlapping part, a part or all of the first area further faces the liquid cooling pipe 15, so that heat in the first area is quickly transferred to the liquid cooling pipe 15, to further improve heat dissipation efficiency.

Optionally, the projection of the liquid cooling pipe 15 on the middle frame 11 is located in the projection of the first heat dissipation assembly 13 on the middle frame 11. In other words, a length and a width of a first graphene sheet in a horizontal direction are greater than a length and a width of the liquid cooling pipe 15.

When the projection of the liquid cooling pipe 15 on the middle frame 11 is located in the projection of the first heat dissipation assembly 13 on the middle frame 11, the liquid cooling pipe 15 may quickly transfer the heat to the first heat dissipation assembly 13, so that the first heat dissipation assembly 13 may quickly dissipate the heat, to improve heat dissipation efficiency.

Optionally, a part of the liquid cooling pipe 15 is close to the heat source device 12, and the other part of the liquid cooling pipe 15 is far away from the heat source device 12. The part, of the liquid cooling pipe 15, close to the heat source device 12 is less than the other part, of the liquid cooling pipe 15, far away from the heat source device 12.

For example, referring to FIG. 3, the part, of the liquid cooling pipe 15, close to the heat source device 12 may be an upper part of the liquid cooling pipe 15, and the other part, of the liquid cooling pipe 15, far away from the heat source device 12 may be a lower part of the liquid cooling pipe 15.

For example, the part, of the liquid cooling pipe 15, close to the heat source device 12 may be a one-third upper part of the liquid cooling pipe 15, and the other part, of the liquid cooling pipe 15, far away from the heat source device 12 may be a two-third lower part of the liquid cooling pipe 15.

Referring to FIG. 4, the liquid cooling pipe 15 is disposed on a side, of the middle frame 11, facing the second heat dissipation assembly 14.

The following describes a heat dissipation process of the terminal device shown in the embodiment in FIG. 4.

In a running process of the terminal device, a heat source device 12 of the terminal device generates heat, and the heat source device 12 first transfers the heat to a part that is in the middle frame 11 and that is relatively close to the heat source device 12 (for example, a part attached to the heat source device 12). Optionally, if one end of the heat source device 12 is attached to one end of the liquid cooling pipe 15, the heat source device 12 may further transfer the heat to one end of the liquid cooling pipe 15. The middle frame 11 transfers the received heat inside the middle frame 11. In addition, the middle frame 11 further transfers the heat to one end of the first heat dissipation assembly 13 and one end of the liquid cooling pipe 15. After one end of the liquid cooling pipe 15 receives the heat, the liquid cooling pipe 15 may quickly transfer the heat to the entire liquid cooling pipe 15, so that temperature is relatively evenly distributed in the entire liquid cooling pipe 15. Because the liquid cooling pipe 15 is attached to the middle frame 11, the liquid cooling pipe 15 may transfer the heat to a part that is in the middle frame 11 and that is attached to the liquid cooling pipe 15, and the heat is transferred from the part to another part of the middle frame 11, so that temperature is relatively evenly distributed in the middle frame 11. The middle frame 11 may further transfer heat of each part to the first heat dissipation assembly 13. After the first heat dissipation assembly 13 receives the heat transferred by the middle frame 11, the first heat dissipation assembly 13 transfers the received heat inside the first heat dissipation assembly 13. In addition, the first heat dissipation assembly 13 further transfers the heat to the middle frame 11 or another component (such as a display screen or a housing). When the heat is transferred inside a component (the middle frame 11, the first heat dissipation assembly 13, or the liquid cooling pipe 15), the heat is transferred from a high-temperature part of the component to a low-temperature part of the component. When the heat is transferred between the first heat dissipation assembly and the middle frame 11, the first heat dissipation assembly 13 may transfer the heat to the middle frame 11, and the middle frame 11 may also transfer the heat to the first heat dissipation assembly 13.

The heat generated by the heat source device 12 may be further transferred to a second heat dissipation assembly 14. In addition, heat in the liquid cooling pipe 15 and the middle frame 11 may also be transferred to the second heat dissipation assembly 14. After the second heat dissipation assembly 14 receives the heat, the second heat dissipation assembly 14 transfers the received heat inside the second heat dissipation assembly 14. In addition, the second heat dissipation assembly 14 further transfers the heat to the middle frame 11, the liquid cooling pipe 15, or another component (such as the display screen or the housing). When the heat is transferred among the second heat dissipation assembly, the middle frame 11, and the liquid cooling pipe 15, the heat may be transferred among the three.

Based on any one of the foregoing embodiments, optionally, the terminal device further includes a display screen, and the display screen is disposed on the middle frame 11.

Optionally, the display screen covers the first heat dissipation assembly 13. The terminal device further includes a housing. The housing is disposed on the middle frame 11, and the housing covers the second heat dissipation assembly 14.

Optionally, the display screen covers the first heat dissipation assembly 13 and the second heat dissipation assembly 14.

Based on any one of the foregoing embodiments, optionally, two sides of the heat source device 12 are wrapped with a metal shielding can. For example, the metal shielding can may be made of a copper alloy.

The metal shielding can may protect the heat source device 12. For example, the metal shielding can may reduce electromagnetic interference to the heat source device 12.

Figure 5:
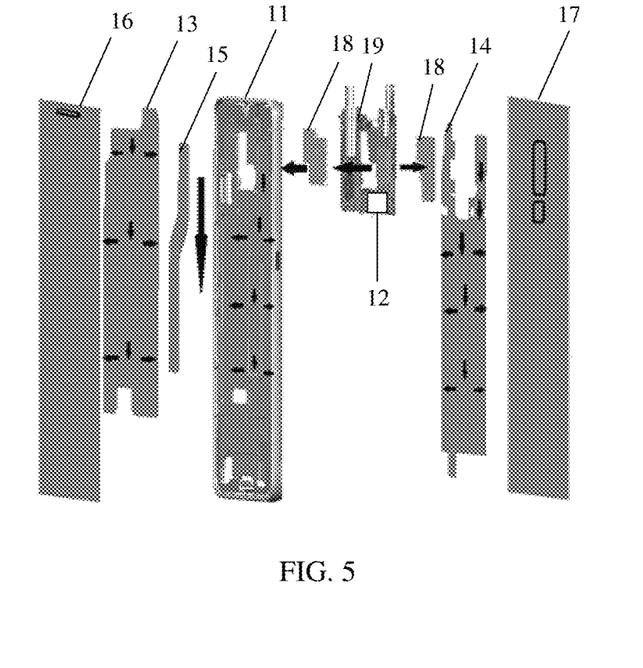
FIG. 5 is a schematic diagram of a structure of yet another terminal device according to an embodiment of this application.
Figure 6:
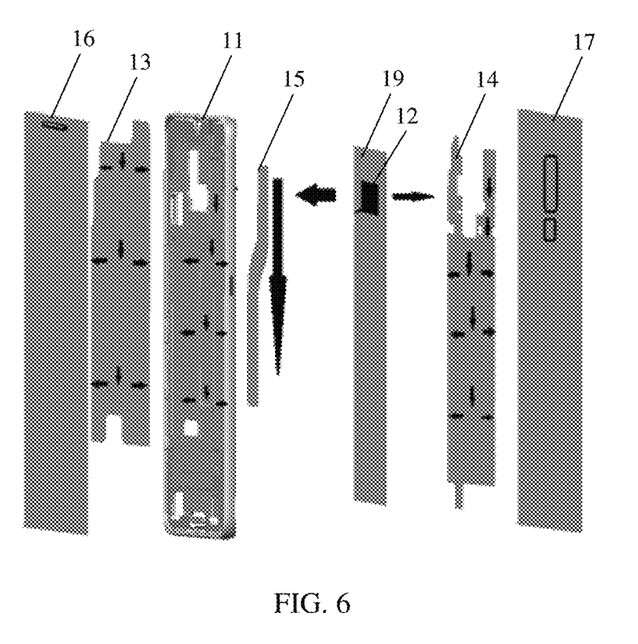
FIG. 6 is a schematic diagram of a structure of still yet another terminal device according to an embodiment of this application.

Based on any one of the foregoing embodiments, the following describes a structure of the terminal device in detail with reference to FIG. 5 and FIG. 6.

FIG. 5 is a schematic diagram of a structure of yet another terminal device according to an embodiment of this application. FIG. 6 is a schematic diagram of a structure of still yet another terminal device according to an embodiment of this application.

Referring to FIG. 5, the terminal device includes a display screen 16, a first heat dissipation assembly 13, a liquid cooling pipe 15, a middle frame 11, a printed circuit board (Printed Circuit Board, PCB) 19, a heat source device 12, a metal shielding can 18, a second heat dissipation assembly 14, and a rear housing 17.

A groove is disposed on a front face (one side) of the middle frame 11, and a shape of the groove is consistent with a shape of the liquid cooling pipe 15. The liquid cooling pipe 15 is disposed in the groove. The first heat dissipation assembly 13 is disposed on a front face of the middle frame 11, the liquid cooling pipe 15 is disposed between the first heat dissipation assembly 13 and the middle frame 11, and the first heat dissipation assembly 13 covers the liquid cooling pipe 15. The display screen 16 is disposed on the front face of the middle frame 11, the first heat dissipation assembly 13 is disposed between the middle frame 11 and the display screen 16, and the display screen 16 covers the first heat dissipation assembly 13.

The PCB board 19 is disposed on a rear face (another side) of the middle frame 11, the heat source device 12 is disposed on the PCB board 19, and the heat source device 12 may be a device such as a processor. The metal shielding can 18 is disposed on each of two sides of the PCB board 19. The second heat dissipation assembly 14 is disposed on the rear face of the middle frame 11, and an avoidance hole is disposed on the second heat dissipation assembly 14, to facilitate installation of devices on the PCB board 19. The rear housing 17 is disposed on the rear face of the middle frame 11, the second heat dissipation assembly 14 is disposed between the middle frame 11 and the rear housing 17, and the rear housing 17 covers the second heat dissipation assembly 14. Optionally, a battery may be disposed on a lower side of the PCB board 19.

Optionally, the PCB board 19 may also be referred to as a printed wiring board. The circuit board may be a hard board, a flexible circuit board, or a combination thereof. The circuit board is a single-layer circuit board or a multi-layer circuit board. A wiring and a pad pattern are usually disposed on the circuit board, to dispose an electronic element on the circuit board.

In an actual application process, when the terminal device runs, the heat source device 12 generates heat, and the heat is transferred to the middle frame 11. Along the front face of the middle frame 11, the middle frame 11 transfers the heat to the liquid cooling pipe 15 and the first heat dissipation assembly 13. The first heat dissipation assembly 13 may further transfer the heat to the display screen 16, and the display screen 16 dissipates the heat to air. Along the rear face of the middle frame 11, the middle frame 11 and/or the heat source device 12 transfer/transfers the heat to the second heat dissipation assembly 14, the second heat dissipation assembly 14 transfers the heat to the rear housing 17, and the rear housing 17 dissipates the heat to the air. In the foregoing process, at least one of the first heat dissipation assembly 13 and the second heat dissipation assembly 14 is a graphene heat dissipation assembly. Because the graphene heat dissipation assembly and the liquid cooling pipe 15 have relatively good heat transfer performance, the graphene heat dissipation assembly and the liquid cooling pipe 15 may quickly transfer the heat generated by the heat source device 12, to improve heat dissipation efficiency of the terminal device. In this way, the heat can be more evenly distributed in the terminal device.

It should be noted that, for a heat transfer direction, reference may be made to directions indicated by arrows in FIG. 5.

Referring to FIG. 6, the terminal device includes a display screen 16, a first heat dissipation assembly 13, a middle frame 11, a liquid cooling pipe 15, a PCB board 19, a heat source device 12, a second heat dissipation assembly 14, and a rear housing 17.

The first heat dissipation assembly 13 and the display screen 16 are disposed on a front face (one side) of the middle frame 11, the first heat dissipation assembly 13 is disposed between the display screen 16 and the middle frame 11, and the display screen 16 covers the middle frame 11.

A groove is disposed on a rear face (another side) of the middle frame 11, and a shape of the groove is consistent with a shape of the liquid cooling pipe 15. The liquid cooling pipe 15 is disposed in the groove. The PCB board 19 is disposed on the rear face of the middle frame 11, the liquid cooling pipe 15 is disposed between the middle frame 11 and the PCB board 19, and the PCB board 19 covers the liquid cooling pipe 15. The second heat dissipation assembly 14 is disposed on the rear face of the middle frame 11, the PCB board 19 is disposed between the middle frame 11 and the second heat dissipation assembly 14, and an avoidance hole is disposed on the second heat dissipation assembly 14, to facilitate installation of devices on the PCB board 19. The rear housing 17 is disposed on the rear face of the middle frame 11, the second heat dissipation assembly 14 is disposed between the rear housing 17 and the middle frame 11, and the rear housing 17 covers the second heat dissipation assembly 14. Optionally, a battery may be further disposed on a side in a width direction of the PCB board 19.

In an actual application process, when the terminal device runs, the heat source device 12 generates heat, and the heat is transferred to the middle frame 11. Along the front face of the middle frame 11, the middle frame 11 transfers the heat to the first heat dissipation assembly 13. The first heat dissipation assembly 13 may further transfer the heat to the display screen 16, and the display screen 16 dissipates the heat to air. Along the rear face of the middle frame 11, the heat source device 12 may transfer the heat to the liquid cooling pipe 15 and the second heat dissipation assembly 14, the second heat dissipation assembly 14 transfers the heat to the rear housing 17, and the rear housing 17 dissipates the heat to the air. In the foregoing process, at least one of the first heat dissipation assembly 13 and the second heat dissipation assembly 14 is a graphene heat dissipation assembly. Because the graphene heat dissipation assembly and the liquid cooling pipe 15 have relatively good heat transfer performance, the graphene heat dissipation assembly and the liquid cooling pipe 15 may quickly transfer the heat generated by the heat source device 12, to improve heat dissipation efficiency of the terminal device. In this way, the heat can be more evenly distributed in the terminal device.

In this embodiment of this application, the terminal device may be of a cuboid structure, or may be of a sliding structure, for example, including a fastening part and a sliding part. Alternatively, the terminal device is of a foldable structure, for example, including a fastening part and a foldable part. In this case, a whole including the middle frame 11, the first heat dissipation assembly 13, the second heat dissipation assembly 14, the heat source device 12, the circuit board, and the like may be disposed in a part of the terminal device, or separately disposed in a plurality of parts. This is not limited.

According to the terminal device in the embodiments of the present invention, by using a combination of the first heat dissipation assembly 13, the second heat dissipation assembly 14, and the liquid cooling pipe 15, the heat of the heat source device 12 may be quickly transferred along a height direction of the terminal device through the liquid cooling pipe 15, and then dissipates in a horizontal direction through the middle frame 11, the first heat dissipation assembly 13, and the second heat dissipation assembly 14, so that the heat is more evenly distributed in the terminal device, and a temperature rising speed is reduced. The terminal device provides better user experience in scenarios with high power consumption, such as games.

It should be noted that in this specification, that "at least one of the first heat dissipation assembly and the second heat dissipation assembly is a graphene heat dissipation assembly" includes that the first heat dissipation assembly is the graphene heat dissipation assembly, or that the second heat dissipation assembly is the graphene heat dissipation assembly, or that the first heat dissipation assembly and the second heat dissipation assembly are graphene heat dissipation assemblies.

It should be noted that "first" and "second" in this specification are merely used for differentiation, and do not limit a sequence.

It should be noted that the "graphite film" mentioned in this specification may also be referred to as a graphite heat conductive sheet, a graphite heat dissipation film, or a heat conductive graphite sheet.

The foregoing descriptions are merely specific implementations of the present invention, but are not intended to limit the protection scope of the present invention. Any variation or replacement readily figured out by a person skilled in the art within the technical scope disclosed in this application shall fall within the protection scope of the present invention. When no conflict occurs, the implementations of the present invention and the features in the implementations may be mutually combined. Therefore, the protection scope of the present invention shall be subject to the protection scope of the claims.

What is claimed is:

1. A terminal device, comprising:
   a middle frame, comprising a metal material or an alloy material;
   a printed circuit board (PCB);
   a heat source device disposed on the PCB;
   a first graphene heat dissipation assembly disposed on a first side of the middle frame;
   a second graphene heat dissipation assembly, wherein the heat source device, the PCB, and the second graphene heat dissipation assembly are disposed on a second side of the middle frame; and
   a liquid cooling pipe attached to the middle frame, wherein a projection of the liquid cooling pipe on the middle frame and a projection of the heat source device on the middle frame have an overlapping part, and the projection of the liquid cooling pipe on the middle frame is located in a projection of the first graphene heat dissipation assembly on the middle frame, and the liquid cooling pipe is disposed between the first graphene heat dissipation assembly and the middle frame.

2. The terminal device according to claim 1, wherein the projection of the heat source device on the middle frame and the projection of the first graphene heat dissipation assembly on the middle frame have an overlapping part.

3. The terminal device according to claim 1, wherein the projection of the heat source device on the middle frame is located in the projection of the first graphene heat dissipation assembly on the middle frame.

4. The terminal device according to claim 1, wherein the projection of the heat source device on the middle frame and a projection of the second graphene heat dissipation assembly on the middle frame have an overlapping part.

5. The terminal device according to claim 1, wherein the projection of the heat source device on the middle frame is located in the projection of the second graphene heat dissipation assembly on the middle frame.

6. The terminal device according to claim 1, wherein each graphene heat dissipation assembly of the first graphene heat dissipation assembly and the second graphene heat dissipation assembly comprises an avoidance hole.

7. The terminal device according to claim 1, wherein the liquid cooling pipe faces the first graphene heat dissipation assembly on the middle frame, and the liquid cooling pipe is further attached to the first graphene heat dissipation assembly.

8. The terminal device according to claim 1, wherein the liquid cooling pipe comprises any one of an ultra-thin heat pipe, an ultra-thin vapor chamber, or a loop heat pipe.

9. The terminal device according to claim 1, wherein the liquid cooling pipe is accommodated in an opening groove that is comprised in the middle frame, and a shape of the opening groove matches a shape of the liquid cooling pipe.

10. The terminal device according to claim 1, wherein a first part of the liquid cooling pipe is closest to the heat source device, and a second part of the liquid cooling pipe is farthest from the heat source device, and wherein the first part of the liquid cooling pipe is smaller than the second part of the liquid cooling pipe.

11. The terminal device according to claim 1, wherein a thickness of the first graphene heat dissipation assembly is different from a thickness of the second graphene heat dissipation assembly.

12. The terminal device according to claim 1, wherein a thickness of the first graphene heat dissipation assembly or the second graphene heat dissipation assembly is 42 micrometers.

13. The terminal device according to claim 1, wherein the terminal device further comprises a display screen, and the display screen is disposed on the middle frame.

14. The terminal device according to claim 13, wherein the display screen covers the first graphene heat dissipation assembly.

15. The terminal device according to claim 14, wherein the terminal device further comprises a housing, the housing is disposed on the middle frame, and the housing covers the second graphene heat dissipation assembly.

16. The terminal device according to claim 13, wherein the display screen covers the first graphene heat dissipation assembly and the second graphene heat dissipation assembly.

17. The terminal device according to claim 1, wherein two sides of the heat source device are wrapped with a metal shielding can.

18. A terminal device, comprising:
  a middle frame, wherein the middle frame comprises a metal material or an alloy material;
  a printed circuit board (PCB);
  a heat source device, wherein the heat source device is disposed on the PCB;
  a display screen;
  a first graphene heat dissipation assembly disposed on a first side of the middle frame;
  a second graphene heat dissipation assembly, wherein the heat source device, the PCB, and the second graphene heat dissipation assembly are disposed on a second side of the middle frame; and
  a liquid cooling pipe attached to the middle frame, wherein a projection of the liquid cooling pipe on the middle frame and a projection of the heat source device on the middle frame have an overlapping part, and the projection of the liquid cooling pipe on the middle frame is located in a projection of the first graphene heat dissipation assembly on the middle frame, wherein the liquid cooling pipe is disposed between the first graphene heat dissipation assembly and the middle frame; and
  wherein the display screen covers the first graphene heat dissipation assembly.

* * * * *